United States Patent [19]
Ehsani

[11] Patent Number: 5,852,358
[45] Date of Patent: Dec. 22, 1998

[54] CAPACTIVE POWER CIRCUIT

[75] Inventor: Mehrdad Ehsani, Bryan, Tex.

[73] Assignee: The Texas A&M University System, College Station, Tex.

[21] Appl. No.: 762,011

[22] Filed: Dec. 11, 1996

[51] Int. Cl.⁶ .................................................. G05F 1/10
[52] U.S. Cl. .................................... 323/240; 320/166
[58] Field of Search ................................. 323/210, 234, 323/237, 240, 259, 261, 264, 305, 310, 328, 329, 340, 344; 363/91; 320/166, 167; 327/111, 365

[56] References Cited

U.S. PATENT DOCUMENTS

| | | | |
|---|---|---|---|
| Re. 29,048 | 11/1976 | Brown | 363/91 |
| 3,385,973 | 5/1968 | Abrams et al. | 323/240 |
| 4,039,866 | 8/1977 | Komuro et al. | 323/240 |
| 4,107,757 | 8/1978 | Masuda et al. | 361/235 |
| 4,307,331 | 12/1981 | Gyugyi | 323/210 |
| 4,688,536 | 8/1987 | Mitsuyasu et al. | 123/490 |
| 4,733,106 | 3/1988 | Okutsu et al. | 307/270 |

FOREIGN PATENT DOCUMENTS

| | | |
|---|---|---|
| 0126325A2 | 11/1984 | European Pat. Off. . |
| 0360117A2 | 3/1990 | European Pat. Off. . |
| 0464443A1 | 1/1992 | European Pat. Off. . |

OTHER PUBLICATIONS

Thyristor Controlled Single Phase Variable inductor, Sen et al., pp. 240–244 Sep. 1, 1967.

*Primary Examiner*—Adolf Berhane
*Attorney, Agent, or Firm*—Howard & Howard

[57] ABSTRACT

A circuit for controlling power to a capacitive load includes a DC power source coupled in series with an inductor and the capacitive load. The inductor provides for resonant charging of the capacitive load from the DC source. A second inductor is used for resonantly discharging the capacitive load back to the power source. Solid state switches are included for selectively activating the charging and discharging of the capacitive load. An energy absorbing load is selectively coupled across the capacitive load to remove any residual voltage after a discharging process.

15 Claims, 5 Drawing Sheets

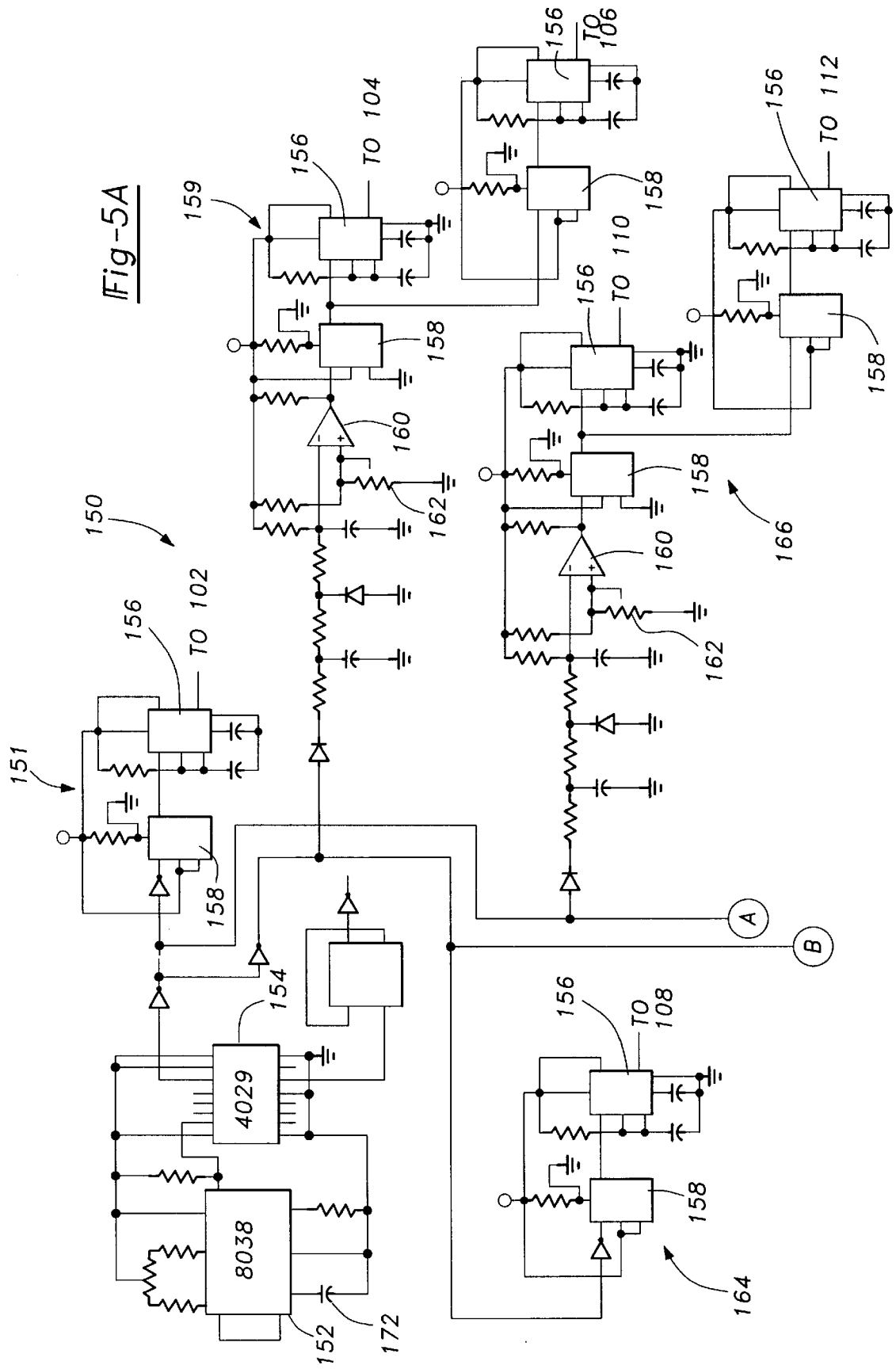

CAPACTIVE POWER CIRCUIT

BACKGROUND OF THE INVENTION

This invention generally relates to circuitry for controlling power to a capacitive load. More particularly, this invention relates to circuitry for controlling the charging and discharging of a capacitive load using a DC power source.

Many electrical loads are capacitive or have performance characteristics that are capacitive in nature. Such loads typically require high power and a high level voltage source to charge them to a prescribed voltage. The charged capacitor energy is then returned to the power supply. Depending on the type of load, between all and none of the charged capacitor energy is returned to the supply. Under many circumstances, the process of charging and discharging must be repeated at a high repetition rate.

Examples where repetitive capacitor charging and discharging is needed is in high voltage capacitor manufacturing and testing. The capacitor first is charged to its full voltage, or possible beyond a full voltage if destructive testing is undertaken. After a prescribed interval of time, the capacitor energy is then discharged. Conventionally, the energy discharged from the capacitor was dissipated into a resistive load. When the process of charging and discharging is repeated over a long period of time, and with many capacitors, utilizing resistive loads in the discharging phase is very inefficient and wasteful of energy. Moreover, such systems require an expensive resistive load and a sophisticated heat management arrangement to maintain continuous operation. Accordingly, the efficiency of the charging and discharging circuitry has a direct effect on the costs associated with such a system.

In some circumstances, a capacitive load may be charged to a prescribed voltage so that some of the capacitor energy can be used in the load while the rest is returned to the source. One example of this type of capacitive load is a piezoelectric motor. Piezoelectric motors require that the charging and discharging process be conducted at high frequencies. Only a small percentage of the capacitor energy within the piezoelectric motor is converted to mechanical work. Accordingly, the remainder of the energy must be taken out of the motor (during a discharge phase) in preparation for the next stroke in the motor. An important aspect of piezoelectric motor drives is improving efficiency. Therefore, conventional systems where the leftover energy in the capacitive load is dumped into a resistor does not present a workable solution. The leftover energy in the piezoelectric motor must be efficiently returned to the power source. These considerations are particularly significant when the piezoelectric motor drive is of significant size, such as one or more horsepower.

Other examples of capacitive loads that have to be charged to a prescribed voltage and then discharged to a pulsed load include pulsed laser tubes, pulsed xenon lamps, and other pulsed discharge tubes or loads. Where high power and high repetition rates are associated with such applications, a high efficiency charging circuit is crucial for economical and practical operation of such loads.

Therefore, there is a need for extremely high efficient power converters that operate at high power and high voltage, yet remain economical and practical. Prior to this invention, circuitry meeting these qualifications has not been developed.

This invention provides circuitry having the necessary characteristics for efficiently powering a capacitive load in the manner described above. This invention is a simple and rugged power supply circuit for charging capacitive loads and discharging capacitive loads at high or low frequencies. The inventive power control circuitry can be controlled in a manner that controls the voltage wave form that is placed on the capacitive load.

SUMMARY OF THE INVENTION

In general terms, this invention is a power circuit for use in powering a capacitive load. The power circuit of this invention includes a DC voltage source coupled with the capacitive load. A first inductor is in series with the capacitive load and coupled between the capacitive load and the DC source. A first solid state switch is placed in series with the first inductor between the capacitive load and the DC source. The first switch permits current flow in a first direction from the DC source toward the capacitive load for charging the capacitive load through the first inductor. A second inductor is placed in series with the capacitive load and coupled between the load and the DC source. A second solid state switch is placed in series with the second inductor. The second solid state switch is coupled between the capacitive load and the DC source and permits current flow in a second direction from the load toward the source to allow the load to be discharged back to the source. Trigger circuitry is included for selectively activating the first and second solid state switches. By selectively activating the solid state switches, the capacitive load is selectively charged and discharged.

In a preferred embodiment of this invention, a third solid state switch is placed in series with an energy absorbing load and in parallel with the capacitive load. The third solid state switch is activated by the trigger circuitry to allow any residual energy on the capacitive load, which remains after the discharging sequence, to flow into and be absorbed by the energy absorbing load.

The method associated with this invention for controlling power to a capacitive load includes four basic steps. First, the capacitive load is resonantly charged to a selected voltage, using a DC power source. Then, the voltage level on the capacitive load is maintained at a selected level for a selected period of time. The capacitive load is next resonantly discharged to the DC power source. Any residual energy on the capacitive load, which remains after the discharging, is then removed through an energy absorbing load.

The various features and advantages of this invention will become apparent to those skilled in the art from the following detailed description of the presently-preferred embodiment. The drawings that accompany the detailed description can be described as follows.

BRIEF DESCRIPTION OF THE DRAWINGS

FIGS. 5a and 5b schematically illustrate triggering circuitry for use with the embodiment of FIG. 3.

DETAILED DESCRIPTION OF THE PREFERRED EMBODIMENT

Figure 1:
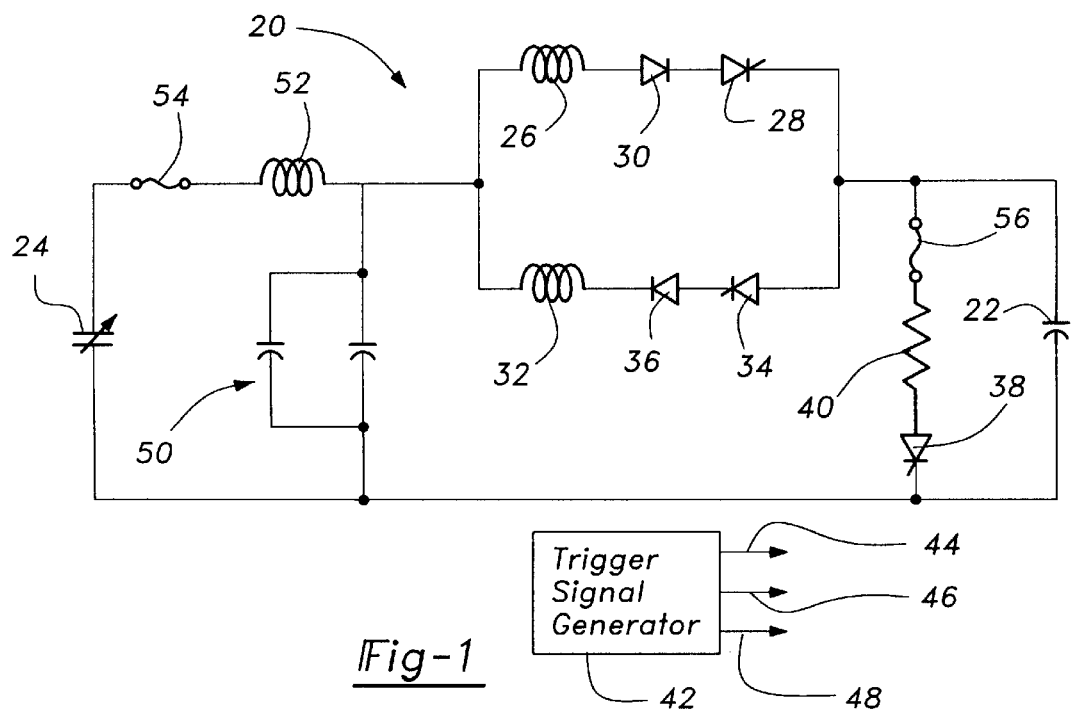
FIG. 1 is a schematic illustration of a circuit designed according to this invention.

FIG. 1 schematically illustrates a power control circuit 20 that is useful for controlling the power of a capacitive load 22. A DC power source 24 is connected to the capacitive load 22 through a first inductor 26 and a first solid state switch 28. A rectifier diode 30 preferably is coupled between the inductor 26 and the switch 28 for reasons that will be described below. The first inductor 26 and the first switch 28 are used for charging the capacitive load 22 as will be described in detail below. A second inductor 32 and a second solid state switch 34 are coupled in series between the DC source 24 and the capacitive load 22 as illustrated. The second inductor 32 and the second switch 34 are used for discharging the capacitive load 22 as will be described below.

A third solid state switch 38 is connected in series with an energy absorbing load 40, which is illustrated as a resistor. The switch 38 and the energy absorbing load 40 are coupled across the capacitive load 22 for removing any residual voltage from the capacitor, as will be described below.

Figure 5B:
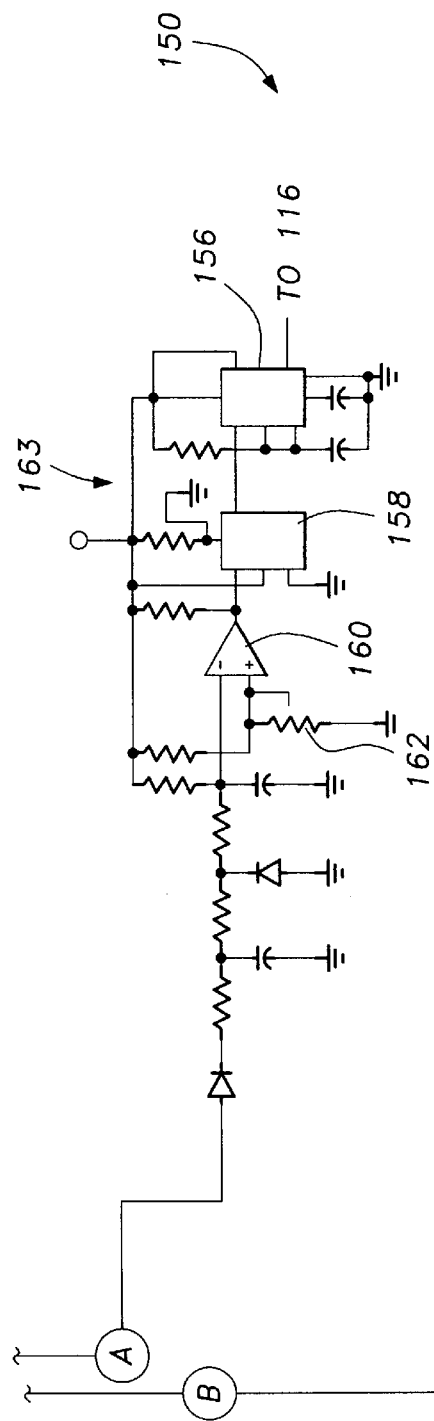
Figure 5B:
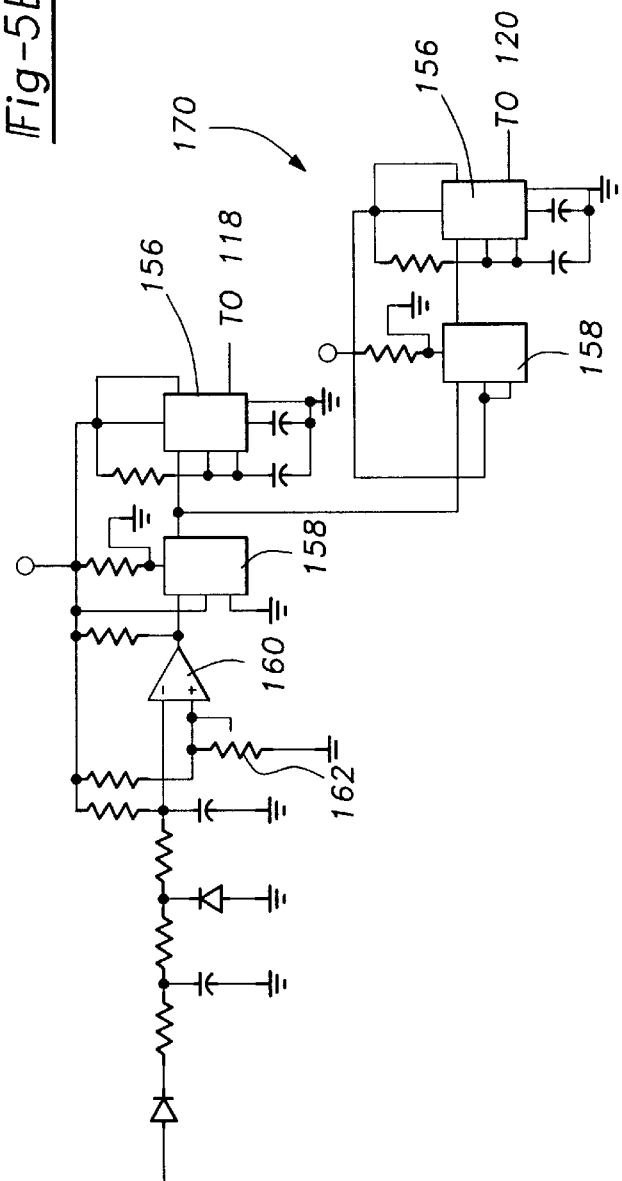

Trigger circuitry 42 is provided for activating the switches 28, 34 and 38. The signal leads 44, 46 and 48 from the trigger circuitry are coupled, in a conventional manner, to the switches 28, 34 and 38, respectively. The trigger circuitry 42 can include various components depending on the needs of a particular application. One example of a currently-preferred embodiment of trigger circuitry 42 is illustrated in FIGS. 5a and 5b.

The circuit 20 also includes a filtering capacitor arrangement 50 and a filtering inductor 52, which serve as a filter for the DC power source 24. Protective fuses 54 and 56 are provided to protect the energy absorbing load 40 from burning out in the event that switch 38 is inadvertently turned on during a charging operation.

Figure 2:
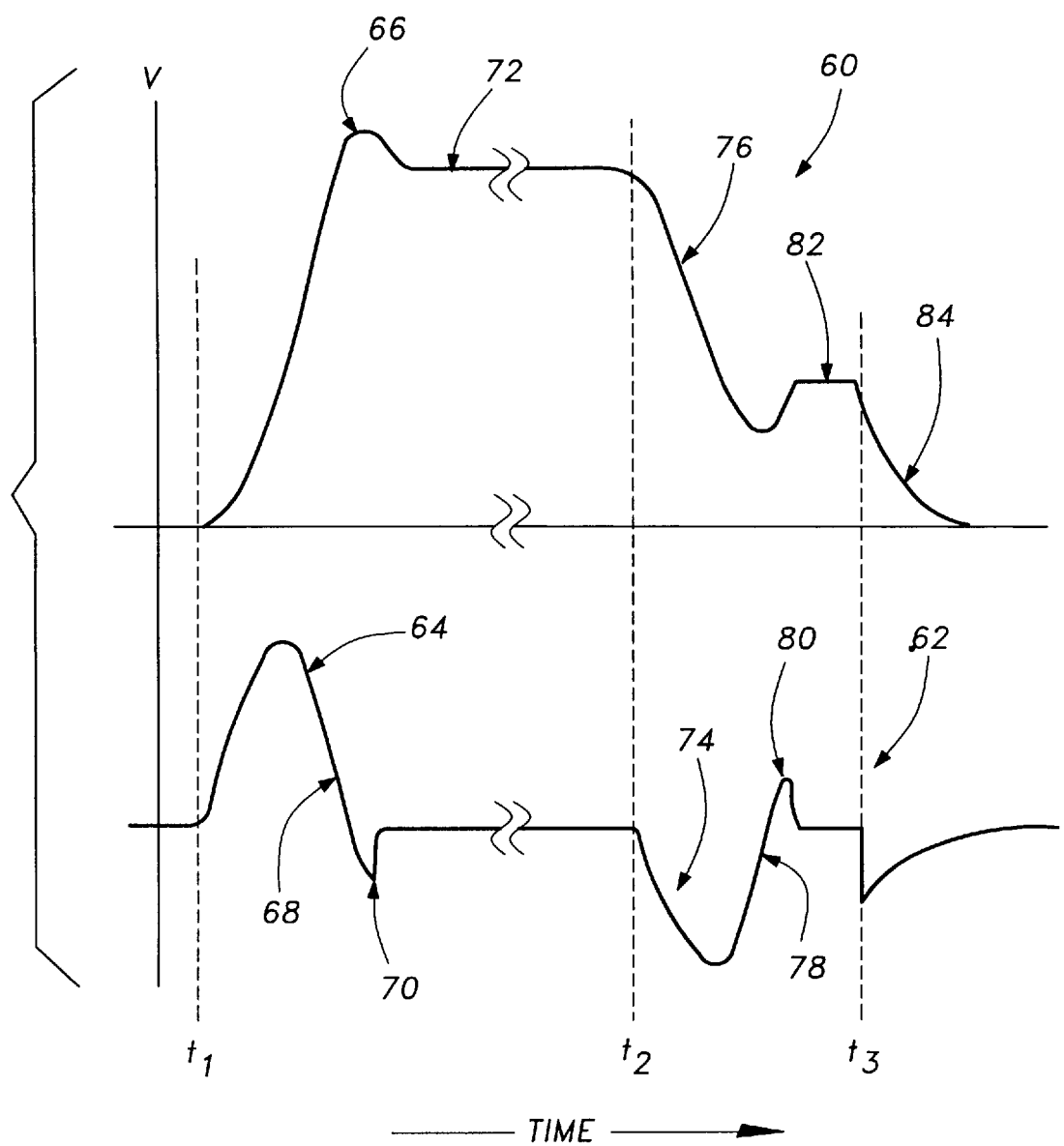
FIG. 2 is a graphical illustration of electrical current and voltage used according to this invention.

Referring now to FIGS. 1 and 2, the operation of the circuitry will be described. FIG. 2 is a graphical representation of a voltage curve 60 and a corresponding current curve 62 plotted against time. At time $t_1$, the trigger circuitry 42 activates the first solid state switch 28. At this point, the voltage source 24 begins to resonantly charge the capacitive load 22 through the first inductor 26. The first half resonance cycle of the charging current is shown at 64. The resonance of the series connection between the source 24, the inductor 26 and the load 22 charges the load capacitor 22 up to nearly two times the source voltage during the first half resonant cycle 64. Accordingly, the voltage reaches a peak at 66 that corresponds to an amplitude of approximately two times the voltage of source 24. At the resonant peak of the load voltage, the current attempts to flow in a reverse direction. This is illustrated in FIG. 2 at 68. The switch 28, which is preferably a silicon-controlled resistor switch, turns off in response to the reverse flow of current. The switch 28 likely requires a small amount of current to flow in the reverse direction to recover its blocking capability before it turns off. This small amount of reverse-flowing current is referred to as reverse recovery current in this specification. The reverse recovery current is illustrated at 70 in FIG. 2. While the reverse recovery current is flowing, the conduction period is extended by a period of several microseconds. Accordingly, the load voltage on the capacitive load 22 reaches a level 72 that is slightly below the peak value. While the switches 28, 34 and 38 are kept off, the voltage on the load capacitor 22 remains constant as illustrated at 72 in FIG. 2.

At the time $t_2$, the switch 34 is turned on using the trigger circuitry 42. The next half resonance cycle 74 resumes when the switch 34 is turned on. The load capacitor 22 discharges (illustrated at 76) through the second inductor 32 until the current reaches zero (illustrated at 78). The switch 34 will then turn off but not until some reverse recovery current 80 flows, which causes a slight increase of the load voltage from its bottom value (illustrated at 82). The remaining or residual voltage at 82 must be removed from the load capacitor 22 before the next charging cycle. If the residual voltage 82 is not cleared before the next cycle initiates, additional residual voltage accumulates on the load capacitor 22 with each subsequent cycle until the residual voltage matches the source voltage. Once the residual voltage equals the source voltage, the resonant operation can no longer occur.

The above-described charging and discharging operation constitutes a single resonant cycle. If the resonance of the circuit 20 were ideal, the load capacitor would discharge completely at the end of the resonance. Losses in the circuit and the reverse recovery current of the switches 28 and 34, however, cause a damping effect that results in the residual voltage being left on the load capacitor 22.

The third switch 38 and the energy absorbing load 40 are provided to remove or clear the residual voltage from the load capacitor 22. Switches 28 and 34 remain off while the third switch 38 is turned on permitting the load capacitor 22 to discharge through the energy absorbing load 40.

Any loss in the circuit 20 is proportional to the magnitude of the residual voltage left on the load capacitor 22. Since efficiency of the powering circuit is of primary importance, the residual voltage is preferably made as small as possible. It has been found that the reverse recovery current of the switches 28 and 34 plays a primary role in increasing the magnitude of the residual voltage. Accordingly, reducing the reverse recovery current improves the efficiency of the overall system. It is most preferable to utilize relatively slow silicon-controlled rectifier switches 28 and 34 in series with rectifiers 30 and 36, respectively. The rectifiers 30 and 36 preferably are fast recovery diodes that serve well to reduce the amount of reverse recovery current. Although a diode in series with the switch and inductor introduces additional conduction loss in the circuit, that drawback is outweighed by the benefit in the reduction of the reverse recovery current.

Alternatives to utilizing a diode in series with a relatively slow silicon-controlled rectifier switch is to utilize inverter grade, fast turn-off SCR's or a fast recovery diode in series with gate turn-off devices such as BJTs, FETs, or MCTs, for example. Fast recover diodes in series with relatively slow SCRs are preferred because inverter grade SCRs of relatively small ratings are becoming obsolete and gate turn-off devices require an isolated gate drive power source for each gate. Introducing additional drive power sources can become prohibitively expensive in some circumstances.

It is most preferred to use separate inductors 26 and 32 instead of one common inductor for charging and discharging. Utilizing a common inductor introduces the drawback of having excessive forward change in voltage over time (dv/dt) at switch turn-off instants. The nature of the capacitive load 22 renders it difficult to avoid the dv/dt problem by using snubber circuits, for example. Another reason why two separate inductors are preferred is to permit the possibility of overlap in the charging and discharging operations where a multiple phase power circuit is needed.

In one example of the illustrated preferred embodiment of FIG. 1, the first and second inductors 26 and 32 preferably have an inductance of 0.2 mH, are wound on ferrite cores, and are designed to allow approximately 50 msec for each charging and discharging period. These characteristics are suitable, for example, where a one-third duty ratio operation at a 2 kHz operating frequency is desired. The characteristic impedance for the circuit 20 having the values noted above is 11.5 ohms and the peak current and RMS currents are 17.3 amps and 5.8 amps, respectively. The RMS current of the switches and inductors is 4.1 amps. A larger inductance can be used to reduce the peak charging or discharging current and the reverse recovery current. The choice of an inductance is limited by the operating frequency of the system and cost and size considerations. An inductance of less than 0.1 mH, has been found to result in too high a peak current that may cause high audible noise and EMI problems.

Those skilled in the art will appreciate that different values for the various circuit components of the circuit 20 can be chosen depending on the particular needs of a given situation.

Figure 3:
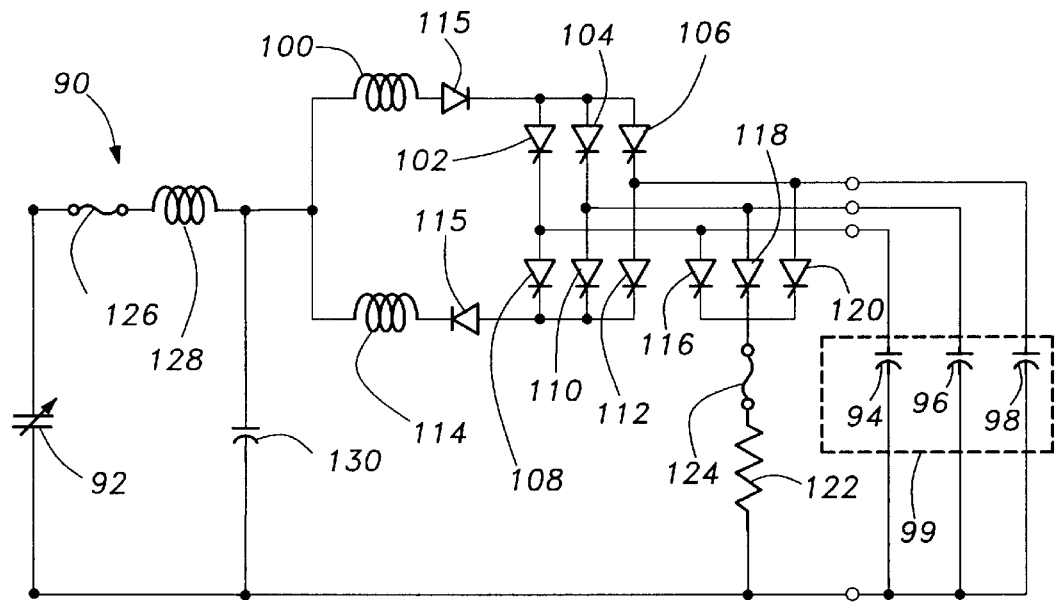
FIG. 3 is a schematic diagram illustrating another circuit designed according to this invention.

FIG. 3 is a schematic illustration of control circuitry 90. The circuitry 90 can be used, for example, with a three-phase piezoelectric motor as the capacitive load. The control circuitry 90 includes a DC power source 92 and three load capacitors 94, 96 and 98. In the event that the capacitive load is a piezoelectric motor 99, the load capacitor 94 and the load capacitor 96 correspond to the two lifter stacks of the piezoelectric motor while the load capacitor 98 corresponds to the torquer stack. A first inductor 100 is coupled in series between the source 92 and the capacitive loads to resonantly charge each of the loads. A plurality of first solid state switches 102, 104 and 106 are provided to selectively couple the source 92 to each of the load capacitors 94, 96 and 98, respectively. A plurality of second solid state switches 108, 110 and 112 are coupled in series between the capacitive loads and the DC source 92. A second inductor 114 is provided for resonantly discharging the capacitive loads through the plurality of second solid state switches. It is most preferred that a fast recovery diode 115 is coupled between the inductors and the plurality of switches, biased in an appropriate direction to obtain the benefits described above with respect to the embodiment of FIG. 1. The first plurality of switches share a single inductor 100 and fast recovery diode 115, while the second plurality of switches share the second inductor 114 and a fast recovery diode.

A third plurality of residual voltage clearing solid state switches 116, 118 and 120 are provided to selectively discharge any residual voltage from the capacitive loads through an energy absorbing load 122, which is illustrated as a resistor.

The circuitry 90 includes protective fuses 124 and 126, which operate the same as the protective fuses 54 and 56 described above. A filtering inductor 128 and a filtering capacitor 130 are provided for filtering out relatively low frequency fluctuations of the source voltage.

A constraint on the circuit 90 is that it cannot initiate charging of one phase while another phase is already charging. Similarly, discharging one phase or load capacitor cannot be initiated while another phase is already discharging. Simultaneous charging or discharging of two or all of the capacitive loads is possible if inductors are used having an appropriate rating. Simultaneous charging or discharging is not preferred, however, because a sequential operation can be used effectively. Charging one phase while another phase is discharging is always possible. Simultaneous charging of one phase while discharging another has the benefit that the charging current of the one phase and the discharging current of the other are cancelled by each other, resulting in a small input current. Therefore, if possible, the charging and discharging preferably overlap between different phases. When there is the preferred overlap between charging and discharging of different phases, the required input filter capacitance 130 need usually only be a few tens of microfarads. The filter inductance 128 can also be reduced.

Although various driving strategies are possible with a three-phase circuit, the specifics of the capacitive load requires a specific sequence of excitation. When the capacitive load is a piezoelectric motor, there are two basic requirements on any excitation sequence. First, at least one lifter stack must be excited throughout the operation. Second, the excitation and de-excitation of the torquer stack is accomplished when only one of the lifter stacks is being excited.

Figure 4:
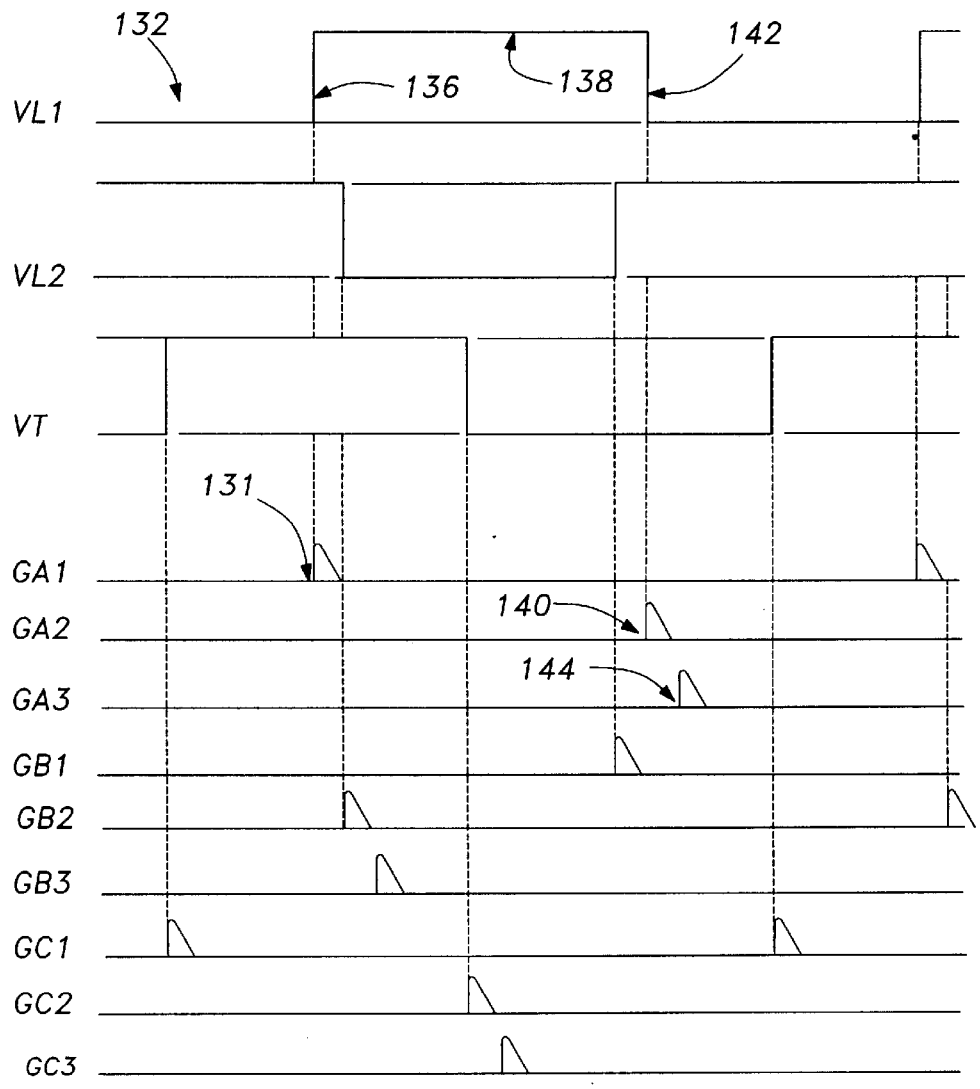
FIG. 4 is a timing diagram illustrating a preferred sequence of switch operation according to this invention.

FIG. 4 includes a timing diagram 132 that illustrates a preferred excitation sequence for the circuit 90 where the capacitive load is a piezoelectric motor. The voltage wave forms VL1, VL2 and VT in FIG. 4 represent idealized voltage wave forms applied to the first lifter stack (schematically represented by the load capacitor 94), the second lifter stack (schematically represented by the load capacitor 96), and the torquer stack (schematically represented by the load capacitor 98), respectively. The gating signals GA1 through GC3 correspond to the triggering signals to activate the solid state switches. GA1 corresponds to the switch 102, GA2 corresponds to the switch 104, and GA3 corresponds to the switch 106. GB1 corresponds to the switch 108, GB2 corresponds to the switch 110, and GB3 corresponds to the switch 112. GC1 corresponds to the switch 116, GC2 corresponds to the switch 118, and GC3 corresponds to the switch 120.

The operation illustrated in FIG. 4 can be understood by considering the charging and discharging of load capacitor 94 as an example. At the point 134, the trigger circuitry activates the switch 102. At this point, the load capacitor 94 begins being charged at 136. The capacitor 94 reaches the voltage at 138 in the manner described above and illustrated in FIG. 2, for example. The voltage 138 is maintained on the load capacitor 94 until the switch 108 is opened when the triggering signal 140 is generated. At that instant, the load capacitor 94 discharges (represented at 142). Following the time when the switch 108 turns off, the switch 116 is activated by the triggering signal 144 to allow any residual voltage from the load capacitor 94 to be dissipated through the energy absorbing load 122.

As can be appreciated from the illustration of FIG. 4, the timing and operation of the various switches is in accordance with the desired characteristics described above.

The trigger circuit that generates the gating signals preferably is capable of varying the gating instants for experimental purposes. In this manner, the effects of various overlap angles and torquer excitation/de-excitation phases, with respect to lifter operation, on the piezoelectric motor performance can be evaluated. Moreover, the trigger circuitry preferably is able to provide variable frequency signals, which vary in a range from approximately 20 Hz to several kHz.

FIGS. 5a and 5b show a preferred embodiment of a trigger circuit 150. The illustrated circuit has full versatility for changing the phase angle of the control or gating signals. A multivibrator 152, which preferably has a chip identifying number 8038, generates a clock signal that synchronizes the three phase control signals. The clock signal feeds a four-bit synchronous counter 154, which preferably has a chip number 4029. The rising edge of the most significant bit of the counter 154 output is used as a reference that corresponds to zero degrees. The rising edge of the most significant bit of the counter 154 output is also used to generate the signal 134 from FIG. 4. A general purpose multivibrator 156 is used to ensure that there is enough current. Another timer/multivibrator 158 is used prior to the general purpose multivibrator 156 to properly shape the signal from the counter 154 output. The branches of the circuit 151 and 159 are utilized for activating the plurality of first solid state switches 102, 104 and 106.

The zero degree reference signal, which is the rising edge of the most significant bit of the counter 154 output, feeds a comparator 160, which preferably has a chip identifier number 339. A variable resistor 162 is connected to the positive terminal of each comparator 160 and used to adjust the discharging instant of a corresponding phase. The output of the comparator 160 drives a gate amplifier circuit to generate a discharging trigger signal to activate the switch 108. The residual voltage clearing signal is made by delaying the signal fed to the switch 108 through another timer/multivibrator 158 and general purpose multivibrator 156.

The signals to control the charging and discharging of the load capacitor 96 are found at the branches 164 and 166. The timer/multivibrator 158 and general purpose multivibrator 156 of the circuit branch 164 are fed from an inverted output from the most significant bit of the counter 154. Therefore, the charging signal to activate the switch 104 is phase-locked at 180 degrees, with respect to the signal for the switch 102. The discharging and clearing signals for activating switches 110 and 118, respectively, are generated in a similar manner as described above with respect to the switches 108 and 116.

The circuit branches 168 and 170 (illustrated in FIG. 5*b*) are for charging and discharging the load capacitor 98. The signals to activate the charging switch 106 and the discharging switch 112 preferably are generated by delaying the signal of zero degrees and 180 degrees, respectively, with a comparator 160. The variable resistor 162 allows each timing signal to be adjusted over a 180 degree span.

The operating frequency of the overall circuit 150 preferably is adjusted by a variable resistor within the multivibrator 152 circuit. In the illustrated embodiment, the basic adjustable range is from 1 kHz to 2 kHz. Higher or lower frequencies of operation are possible by changing the capacitor in circuitry associated with the multivibrator 152.

Figure 6:
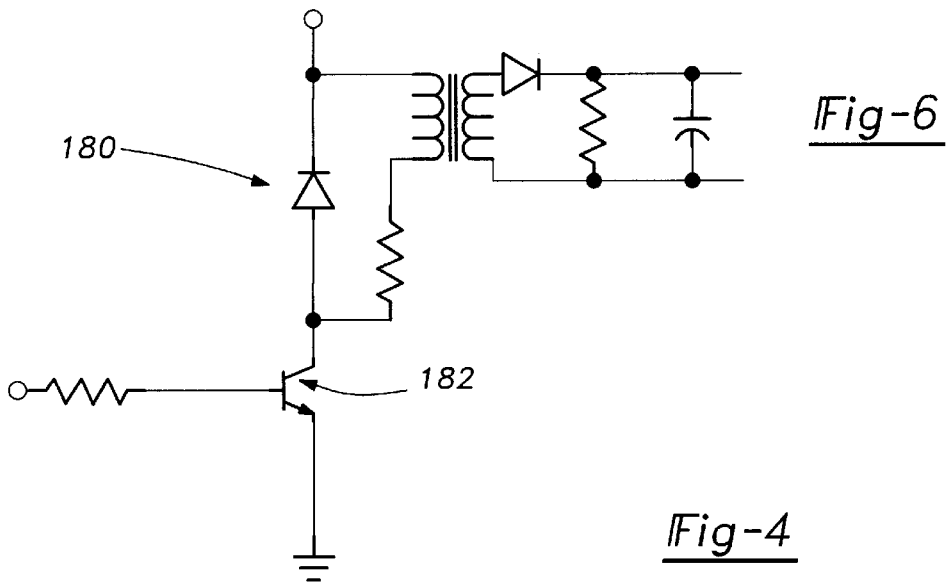
FIG. 6 schematically illustrates a signal amplifier for use with the embodiment of FIGS. 5a, 5b and FIG. 3.

The signals coming from the circuit 150 that are fed to the solid state switches need to be amplified in order to adequately drive the solid state switches. FIG. 6 illustrates a gate signal amplifier circuit 180 for this purpose. The general purpose multivibrator 156 within the circuit 150, generates enough current to saturate the transistor 182 in the gate amplifier circuit 180. Each gate amplifier circuit 180 is electrically coupled with the solid state switches in a conventional manner.

The circuitry described above preferably includes a DC voltage source that can provide voltages in a range from a few hundred to many thousand volts. In some circumstances, a capacitive load such as a piezoelectric motor will need to draw its power from a low voltage source, such as a 12 volt battery. In such circumstances, a prior voltage step-up stage preferably is included in the circuit without deteriorating the converter performance and efficiency. Regardless of the type of DC voltage source, the power control circuitry described above can be used in any application where the load is predominantly capacitive or, in other words, is a reactive load of a capacitive nature. Examples of such loads include piezoelectric motors, high voltage capacitor testers, pulsed loads needing a capacitor to be discharged into them, discharge lamps such as xenon lamps, laser tubes and radars.

The above description is exemplary rather than limiting in nature. Variations and modifications to the disclosed embodiments will become apparent to those skilled in the art that do not necessarily depart from the purview and spirit of this invention. Accordingly, the scope of legal protection for this invention can only be determined by studying the following claims.

What is claimed is:

1. A power circuit for use in powering a capacitive load, comprising:

a DC voltage source coupled with the capacitive load;

a first inductor in series with the capacitive load, coupled between the capacitive load and said DC source;

a first solid state switch in series with said first inductor coupled between the capacitive load and said DC source, said first switch permitting current flow in a first direction from said DC source toward the capacitive load;

a second inductor in series with the capacitive load, coupled between the capacitive load and said DC source;

a second solid state switch in series with said second inductor coupled between the capacitive load and said DC source said second switch permitting current flow in a second direction from the capacitive load toward said DC source;

a rectifier in series with said first solid state switch coupled between said first inductor and said first switch, said rectifier being biased to permit current flow in said first direction; and trigger circuitry for selectively activating said solid state switches, respectively, to thereby selectively charge the capacitive load and selectively discharge the capacitive load.

2. The circuit of claim 1, further comprising a third solid state switch in series with an energy absorbing load, in parallel with the capacitive load, said third solid state switch being activated by said trigger circuitry to thereby remove any residual voltage from the capacitive load after the capacitive load has been discharged by activation of said second switch.

3. The circuit of claim 2, wherein said first, second and third solid state switch each comprise a silicon controlled rectifier switch.

4. The circuit of claim 2, further comprising a fuse in series with said energy absorbing load and said third solid state switch in parallel with the capacitive load and wherein said energy absorbing load comprises a resistor.

5. The circuit of claim 1, further comprising a second rectifier in series with said second solid state switch coupled between said second inductor and said second switch, said second rectifier being biased to permit current flow in said second direction.

6. The circuit of claim 1, further comprising a filter for filtering current flowing out from said DC source, said filter comprising an inductor in series with said DC source and a filtering capacitive load in parallel with said DC source.

7. The circuit of claim 1, wherein there are a plurality of capacitive loads and wherein said circuit further comprises a plurality of said first solid state switches and a plurality of said second solid state switches, respectively, one of each of said first and second switches being associated with each capacitive load.

8. The circuit of claim 7, wherein said trigger circuitry selectively activates respective ones of said plurality of first switches and said plurality of said second switches to thereby selectively charge and discharge selected ones of the plurality of capacitive loads in a predetermined order that includes no more than one capacitive load being charged at any one time.

9. The circuit of claim 8, further comprising a plurality of third solid state switches in series with an energy absorbing load, each said third switch being coupled in parallel with one of the plurality of capacitive loads and wherein said triggering circuitry selectively activates selected ones of said plurality of third switches to thereby discharge any residual voltage from selected ones of the plurality of capacitive loads through said energy absorbing load.

10. A power circuit for controlling power to a plurality of capacitive loads, comprising:

a DC voltage source;

a first inductor, in series with the capacitive loads between the capacitive loads and said DC source;

a plurality of first solid state switches in series with said first inductor, each said first switch being in series with one of the capacitive loads coupled between the capacitive load and said DC source, each said first switch permitting current flow in a first direction from said DC source toward each capacitive load;

a second inductor in series with the capacitive loads between the capacitive loads and said DC source;

a plurality of second solid state switches in series with said second inductor, each said second switch being in series with one of the capacitive loads coupled between the capacitive load and said DC source, each said second switch permitting current flow in a second direction from each capacitive load toward said DC source;

a first rectifier in series with said plurality of first switches, said first rectifier being biased to permit current flow in said first direction;

a second rectifier in series with said plurality of said second switches, said second rectifier being biased to permit current flow in said second direction; and trigger circuitry for selectively activating said solid state switches, respectively, to thereby charge the capacitive loads and discharge the capacitive loads in a preselected sequence.

11. The circuit of claim 10, wherein said first rectifier is in series with said plurality of first switches between said first inductor and said first switches, and wherein said second rectifier is in series with said plurality of second switches between said second inductor and said second switches.

12. The circuit of claim 11, wherein said pluralities of first and second switches comprise silicone controlled rectifiers.

13. The circuit of claim 10, further comprising an energy absorbing load in parallel with the capacitive loads and a plurality of third solid state switches, each in series with said energy absorbing load and wherein said trigger circuitry selectively activates said third solid state switches, respectively, to thereby selectively allow any residual charge on one of said capacitive loads to be discharged through a selected third switch and said energy absorbing load.

14. The circuit of claim 13, wherein said third switches comprise silicone controlled rectifiers.

15. The circuit of claim 10, wherein said capacitive loads comprise a piezoelectric motor.

* * * * *